US011212912B1

(12) United States Patent
Rodriguez et al.

(10) Patent No.: US 11,212,912 B1
(45) Date of Patent: Dec. 28, 2021

(54) PRINTED CIRCUIT BOARD MESH ROUTING TO REDUCE SOLDER BALL JOINT FAILURE DURING REFLOW

(71) Applicant: Microsoft Technology Licensing, LLC, Redmond, WA (US)

(72) Inventors: Benito Joseph Rodriguez, Redmond, WA (US); Shu-Ming Chang, Taoyuan (TW); Dillip Kumar Dash, San Diego, CA (US); Po Chun Yang, Taipei (TW); Juan-Yi Wu, Taipei (TW)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/917,786

(22) Filed: Jun. 30, 2020

(51) Int. Cl.
*H05K 1/02* (2006.01)
*H05K 3/02* (2006.01)
*H05K 3/00* (2006.01)
*H05K 3/34* (2006.01)

(52) U.S. Cl.
CPC ......... *H05K 1/0271* (2013.01); *H05K 1/0298* (2013.01); *H05K 3/0094* (2013.01); *H05K 3/022* (2013.01); *H05K 3/3436* (2013.01)

(58) Field of Classification Search
CPC ..... H05K 1/0271; H05K 1/0224–0227; H05K 3/022; H05K 3/025
See application file for complete search history.

(56) References Cited

U.S. PATENT DOCUMENTS

| 7,173,193 B2 * | 2/2007 | Brodsky | H05K 1/0224 174/255 |
|---|---|---|---|
| 8,014,154 B2 | 9/2011 | Lee | |
| 8,048,794 B2 | 11/2011 | Knickerbocker | |
| 9,257,412 B2 | 2/2016 | Chuang et al. | |
| 9,349,663 B2 | 5/2016 | Chen et al. | |
| 9,502,360 B2 | 11/2016 | Lin et al. | |
| 10,064,276 B2 | 8/2018 | Williams et al. | |
| 2004/0091622 A1 * | 5/2004 | Fernandes | B32B 27/04 427/355 |

(Continued)

OTHER PUBLICATIONS

Gagnon, et al., "Thermo-Compression Bonding and Mass Reflow Assembly Processes of 3D Logic Die Stacks", In Proceedings of IEEE 67th Electronic Components and Technology Conference, Jan. 8, 2017, pp. 116-122.

(Continued)

*Primary Examiner* — Jeremy C Norris
(74) *Attorney, Agent, or Firm* — Ray Quinney & Nebeker; Thomas M. Hardman; Bo Niu

(57) ABSTRACT

Voids are introduced in a copper shape to reduce warpage experienced by a printed circuit board during a reflow process. Copper shapes on an outer layer of a printed circuit board may be used to connect large packages that include ball grid arrays to the printed circuit board. The copper shapes may induce warpage in the printed circuit board during the reflow process. Routing a mesh pattern of voids in the copper shapes may reduce solder ball joint cracking and pad cratering during reflow and make solder joints more reliable. The voids may make the copper shapes less ridged and change the copper heat dissipation profile to remove sharp warpage forces that cause solder joints to experience pad cratering. The voids may be 8 mil×8 mil cuts or indentations in the copper shape.

20 Claims, 8 Drawing Sheets

(56) References Cited

U.S. PATENT DOCUMENTS

| | | | |
|---|---|---|---|
| 2010/0116529 A1* | 5/2010 | Niki | H05K 1/0271 |
| | | | 174/257 |
| 2011/0100692 A1* | 5/2011 | Topacio | H05K 3/3436 |
| | | | 174/260 |
| 2012/0126399 A1 | 5/2012 | Lin et al. | |

OTHER PUBLICATIONS

Tegehall, et al., "Impact of Cracking beneath Solder Pads in Printed Board Laminate on Reliability of Solder Joints to Ceramic Ball Grid Array Packages", In Proceedings of European Space Agency, Mar. 2003, 45 Pages.

* cited by examiner

PRINTED CIRCUIT BOARD MESH ROUTING TO REDUCE SOLDER BALL JOINT FAILURE DURING REFLOW

CROSS-REFERENCE TO RELATED APPLICATIONS

N/A

BACKGROUND

A printed circuit board may support and connect electronic components. A printed circuit board may include a flat sheet of insulating material and a layer of copper foil laminated to the substrate. Chemical etching may divide the copper into separate conducting lines, pads for connections, vias to pass connections between layers of copper, and features such as solid conductive areas for electromagnetic shielding. The tracks may function as wires fixed in place that are insulated by air and the board substrate material.

Components may be soldered onto the printed circuit board. One way to attach components to the printed circuit board is through surface mounting. "Surface mount" components may have leads or other features that are attached to copper traces or pads on the printed circuit board. A surface-mount component may have short pins or leads of various styles, flat contacts, a ball grid array, or terminations on the body of the component. A ball grid array may be a type of surface-mount packaging used for integrated circuits. A ball grid array may consist of an array of solder balls that are attached to a bottom side of a chip package.

After components are placed on the printed circuit board, the printed circuit board may be placed into a reflow soldering oven to undergo a solder reflow process. The solder reflow process may bond the ball grid array to pads on the printed circuit board. During the reflow process, the printed circuit board may experience warpage. Warpage may lead to pad cratering, which impacts reliability of the printed circuit board.

SUMMARY

In accordance with one aspect of the present disclosure, a system is disclosed for mitigating warpage of a printed circuit board. The system includes the printed circuit board. The printed circuit board includes an outer copper layer and a copper shape within the outer copper layer. The copper shape has an outer edge that encloses an area and the area of the copper shape includes voids. The printed circuit board also includes an array of pads within the area enclosed by the copper shape. The system also includes a package. The package includes at least one silicon die and a ball grid array. The ball grid array includes solder balls configured to connect with the array of pads.

The voids may be sufficient in number to reduce a difference in displacement experienced during a reflow process between a middle of the copper shape and an edge of the copper shape.

The voids may be arranged in a mesh pattern and the mesh pattern may be arranged over 10% of the area enclosed by the copper shape.

The voids may be 8 mil×8 mil.

The at least one silicon die may include two or more silicon die.

The solder balls may not be uniform in height.

The printed circuit board may include three or more layers of copper.

The voids may not penetrate to a layer of copper below the outer copper layer.

A region of the area enclosed by the copper shape may not include the voids.

The array of pads may include one or more pads connected directly to the copper shape. The copper shape may provide power to the package. The region may be more proximate to the one or more pads connected directly to the copper shape than at least one other region of the copper shape.

The copper shape may include 30 or more voids.

One or more of the voids may be empty.

In accordance with another aspect of the present disclosure, a printed circuit board is disclosed that includes an outer copper layer and a copper shape within the outer copper layer. The copper shape includes at least 10 voids. The printed circuit board also includes an array of pads arranged within an area of the copper shape. The array of pads are configured to receive a ball grid array attached to a package.

The voids may be sufficient in number to reduce warpage experienced by the copper shape during a reflow process.

The voids may be arranged in a mesh pattern.

One or more of the voids may be at least 8 mil×8 mil.

The printed circuit board may include three or more layers of copper.

The voids may not penetrate to a layer of copper below the outer copper layer.

The copper shape may include voids arranged over at least fifty percent of a portion of the copper shape that does not include the area where the array of pads is arranged.

In accordance with another aspect of the present disclosure, a method is disclosed for mitigating warpage in a printed circuit board. The method includes fabricating a copper shape on a top layer of the printed circuit board, fabricating an array of pads within an area of the copper shape, and introducing voids in the copper shape over a region outside the area. The region includes at least ten percent of the copper shape.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which.

DETAILED DESCRIPTION

Figure 1A:
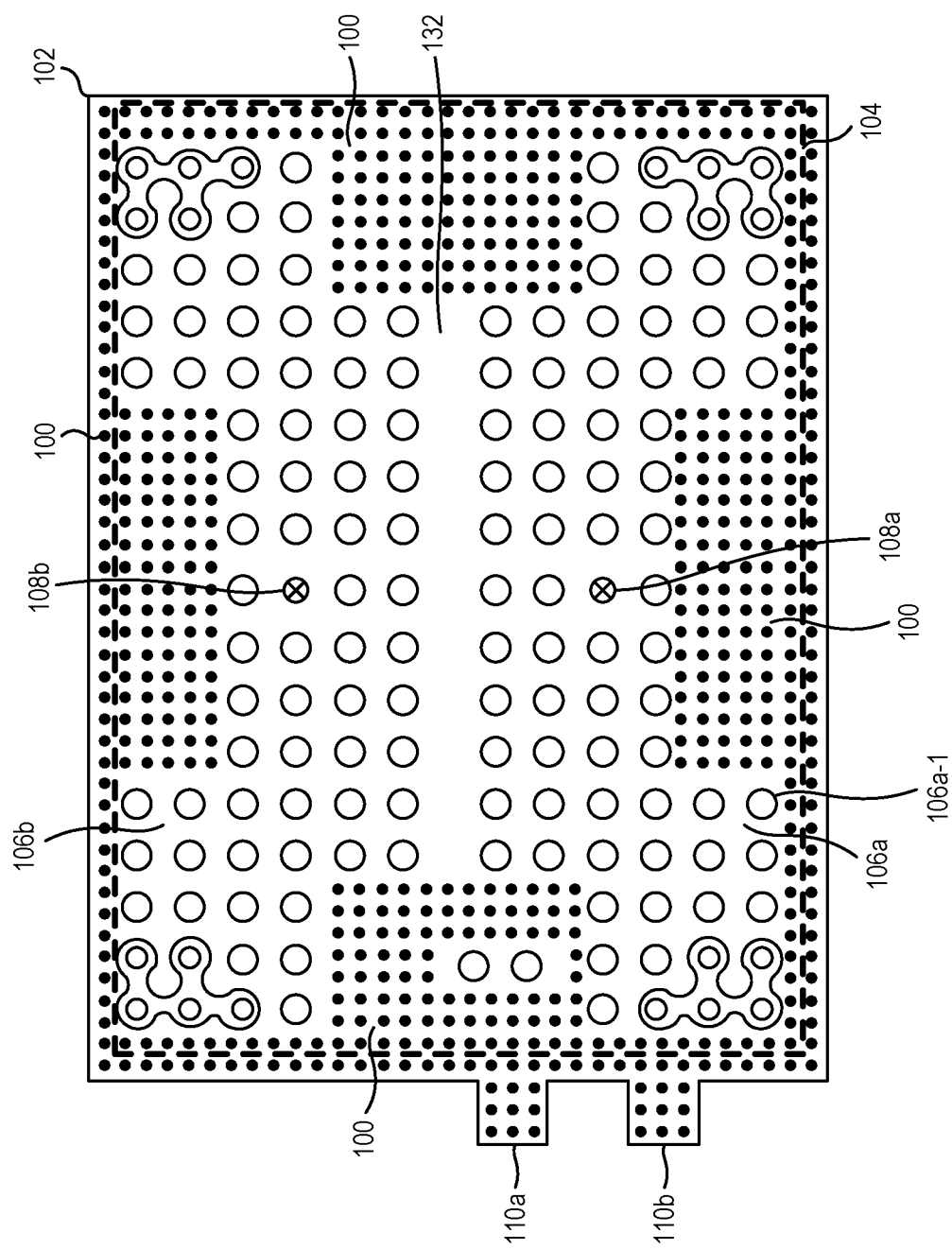
FIG. 1A illustrates an example copper shape with a mesh pattern of voids.

This disclosure concerns use of a mesh pattern of voids etched in a copper shape. The copper shape resides on a top layer of a printed circuit board underneath a large package (such as a multi-die NAND). The mesh pattern of voids reduces warpage experienced by the printed circuit board and the copper shape during a reflow process. The reflow process bonds solder balls attached to the large package to corresponding pads on the printed circuit board. Reducing the warpage of the printed circuit board during the reflow process mitigates the risk of the pads separating from the printed circuit board during reflow and makes connections between the large package and the printed circuit board more reliable long term.

A printed circuit board (PCB) may support and connect electrical or electronic components. A PCB may include a flat sheet of insulating material (a substrate) and a layer of copper foil laminated to the substrate. Chemical etching may divide the copper into separate conducting lines (called tracks or circuit traces), pads for connecting components to the PCB, vias to pass connections between layers of copper, and features such as solid conductive areas for electromagnetic shielding or other purposes. The tracks may function as wires fixed in place that are insulated by air and the board substrate material.

PCBs may be single-sided (one copper layer), double-sided (two copper layers on both sides of one substrate layer), or multi-layer (outer and inner layers of copper, alternating with layers of substrate). For multi-layer PCBs, the copper of each layer may be separated into conducting lines, pads, vias, and features insulated from each other and other copper layers by substrate. Stripline may be a transmission line trace surrounded by dielectric material suspended between two ground planes on internal layers of a PCB. Microstrip routing may be a transmission line trace routed on an external layer of the board. Microstrip may be separated from a single ground plane by a dielectric material. Multi-layer PCB s may allow for higher component density by moving circuit traces that would otherwise use space on a top layer to an inner layer. Conductors on different layers may be connected with vias, copper-plated holes that function as electrical tunnels through the insulating substrate. Through-hole component leads may also effectively function as vias. In four-layer designs, often two layers are dedicated as power supply and ground planes, and the other two are used for signal wiring between components.

Components may be soldered onto the PCB to both electrically connect and mechanically fasten the components to the PCB. Solder may be an electrical material that can bond parts. There may be at least two ways to attach components to the PCB. "Through hole" components may have wire leads and may be mounted by their wire leads passing through the board and soldered to traces on the other side. "Surface mount" components may have leads or other features that are attached to copper traces or pads on a surface layer of the board. A surface-mount component may be smaller than a through-hole counterpart because the surface-mount component may have smaller leads or no leads at all. A surface-mount component may have short pins or leads of various styles, flat contacts, a matrix of solder balls (such as a ball grid array), or terminations on the body of the component. A PCB may use both methods for mounting components.

A ball grid array (BGA) may be used as part of surface-mount packaging (a chip carrier) for integrated circuits. A BGA package may be used to permanently mount devices, such as microprocessors, to a PCB. A BGA package may consist of an array of solder balls that are attached to a bottom side of the package body or carrier of a component. A solder ball (which may also be called a solder bump) may be a ball of solder that provides a contact between a chip package and a PCB. The solder balls may be placed manually or by automated equipment and may be held in place with a tacky flux. Heights of the solder balls may vary across a BGA. For example, solder balls on an edge of the BGA may be slightly shorter than solder balls in the middle of the BGA.

A PCB may have flat copper pads (which may be tin-lead, silver, or gold plated) where components are to be placed. These pads may be referred to as solder pads. Solder paste, which may be a sticky mixture of flux and tiny solder particles, may be applied to the solder pads using a screen printing process. A stainless steel or nickel stencil (which may be referred to as a mask) may include open windows where the pads are located and mask everything else. The stencil may be placed over the PCB and a squeegee may be drawn across the stencil to apply solder paste to the pads where components may be attached. The solder paste may also be applied with a jet-printing mechanism, similar to an inkjet printer. After pasting, the PCB may proceed to a pick-and-place machine that places components on the PCB. The paste may temporarily hold the components in place on the PCB. The paste may not, however, permanently keep the components in place.

After the pick-and-place machine places components on the PCB, the PCB may be placed into a reflow soldering oven to undergo a solder reflow process (which may be referred to as a reflow process) that bonds the components to the PCB. The solder reflow process may be a controlled temperature process that includes multiple stages, such as temperature ramp, constant temperature soak, and cooling. For example, the PCB may ramp up to a pre-heat zone. In the pre-heat zone, the temperature of the PCB and all the components may be gradually and uniformly raised. The PCB may then ramp up to a temperature zone in which the temperature is high enough to melt the solder particles in the solder paste, bonding the component leads to the pads on the PCB. The surface tension of the molten solder may help keep the components in place. After soldering, the PCB may be washed to remove flux residues and any stray solder balls that could short out closely spaced component leads. The PCB may be visually inspected for missing or misaligned components and solder bridging and tested for correct operation.

Connections between components and a PCB need to be reliable. Long-term reliability of the bond created through the reflow process is critical to ensure devices do not fail in the field over time. Large components, such as a controller, a DRAM, or a NAND, may have many attach points to a PCB. These large components may have a number of solder balls or use a BGA to connect to a number of landing spots (or pads) on the PCB. The solder balls may be part of the component packaging and then connect to solder paste on the PCB pads during the pick and place process. The solder balls may bond to the pads during the reflow process.

The reliability of connections between components and the PCB may be tested using a technique called dye and pry. The first step of the dye and pry process may include submerging the PCB in red dye and leaving it to soak for an extended period of time. The time allows the dye to go underneath components and packages attached to the PCB and into all voids, crevices, and cracks between bonding sites. After the PCB has soaked in the red dye, the PCB may be baked to remove all bubbles. In the next stage of the process, a tool mechanically rips components off the PCB. The PCB and the components may be inspected using a microscope to see if bonds are completely clear of dye. The dye may highlight cracks created in solder joint connections during the bonding process.

The dye and pry technique may reveal multiple different types of failures. A first type of failure may be a component pad separating from a component substrate. A second type of failure may be a separation between the component pad and a solder ball. These first two types of errors may be errors caused by a component manufacturer. A third type of failure may be a separation between a solder ball and a PCB pad. A fourth type of failure may be a separation between a PCB pad and a PCB base. A fifth type of failure may be a solder ball crack or double separation.

A dye and pry test may reveal pad cratering, which may be an example of the fourth type of failure. Pad cratering may refer to a weak joint between the PCB pad and the PCB laminations below the pad. Pad cratering may refer to cracks being generated and penetrated into the PCB itself. The cracks may appear between the PCB pad and the substrate of the PCB. Pad cratering may occur at a solder joint (where a solder ball connects to a PCB pad). Pad cratering may result when the PCB pad (which may be connected to a solder ball) pulls off from the PCB lamination materials during the reflow process.

Pad cratering may result from the PCB warping during the reflow process. The PCB may itself warp during the reflow process. The package may also cause or contribute to the warping. Some packages include multiple die inside the package. For example, certain NAND solutions may include multiple die stacked one top of each other inside a package. Dual die per package (DDP) means a stack of 2 die in the same package, quad die per package (QDP) means a stack of 4 die in the same package. Placing packages with multiple die inside may exacerbate warping. As the number of die stacked in a package increases, the package may induce greater warpage stress on the PCB during the reflow process.

During the solder cool down phase, the warpage stress from a package may be focused on certain solder ball zones of the package and may lead to solder ball cracking. As noted previously, solder balls on an edge of the BGA may be slightly shorter than solder balls in the middle of the BGA. Solder balls at the edge of a package may show greater compression while solder balls in the middle of the package may show greater pulling. The solder balls in the middle of the package may experience tremendous stress during the reflow package. Warpage forces that pull on solder joints may lead to pad cratering.

In addition to warpage forces from the package, large copper shapes under the package may impact heat dissipation during the reflow process and cause warpage forces to focus on specific solder joints during reflow. A large package, such as a NAND package, may be placed on a surface layer of the PCB that has a large copper shape for power delivery. A Shadow Moiré test performed on a PCB with a large copper shape may show large warpage forces focus on specific pads. A Shadow Moiré test may be a test performed on a PCB that does not yet have components placed on the PC. The Shadow Moiré test may measure warpage across a PCB or a copper shape at different temperature zones.

The most significant factor in pad cratering may not be the magnitude of displacement experienced at any particular solder joint. Instead, pad cratering may be most severe at solder ball joints located at inflection points. An inflection point may be a location where deformation direction is changing from suppression to pulling. The inflection point may also be a point with the highest rate of change in deflection. A solder joint may be most susceptible to pad cratering if the solder joint is located between a first solder ball that is shorter and experiencing depression during the reflow process and a second solder ball that is taller and experiencing pulling during the reflow process. Thus, pad cratering may be most severe where the solder ball heights are changing most rapidly.

Large component packages require power. As noted above, one way a PCB may bring power to a package is through a copper shape on a top layer of the PCB. A copper shape may be a large piece of copper. The copper shape may be larger than other pads used to connect components to the PCB. The package may be placed over at least a portion of a copper shape and attached to at least one pad that directly connects to or is part of the copper shape. The copper shape may be a large, ridged piece of copper. During the reflow process, the heat dissipation of the copper shape may lead to warpage.

The present disclosure concerns systems and methods for making solder joints more reliable long term. A PCB mesh routing technique may reduce solder ball joint cracking and pad cratering during reflow. The PCB mesh routing technique may reduce solder ball joint cracking and pad cratering caused by warpage forces from large, multi-chip packages placed on a copper shape of a PCB. The mesh routing may take the form of small voids introduced in the copper shape. The small voids may make the copper shape less ridged and reduce warpage. These small voids may change the copper heat dissipation profile to remove the sharp warpage forces that cause solder joints to experience pad cratering. The small voids may be 8 mil×8 mil cuts or indentations in the copper shape but do not go through to another copper layer of the PCB. The voids may be added in a mesh pattern. Even with the voids, the copper shape may deliver sufficient power to the package. A PCB that includes a copper shape with mesh routing may pass a dye and pry test.

FIG. 1A illustrates an example copper shape 102 that includes voids 100. The copper shape 102 may be a piece of copper etched on a top layer of a PCB. The copper shape 102 may be part of the top layer of copper on the PCB. In FIG. 1A, everything within an outer boundary of the copper shape 102 not shown in dark color, subject to two exceptions described below, may be copper. The copper shape 102 may be larger in surface area than one or more other pads residing on the top layer of the PCB. The copper shape 102 may have a largest surface area compared to all other pads or copper features residing on the top layer of the PCB. The copper shape 102 may be configured to connect with a package containing an integrated circuit. The copper shape 102 may be ridged. The copper shape 102 shown in FIG. 1A has a generally rectangular shape. But the copper shape 102 may take the shape of any polygon. For example, the copper shape 102 may be in the general shape of a circle, a triangle, a square, a trapezoid, a parallelogram, a pentagon, or a hexagon. The copper shape 102 may also have an irregular shape. As shown in FIG. 1A, the copper shape 102 may include protrusions 110a, 110b.

Within an area encompassed by a boundary (or outside edge) of the copper shape 102, there may be pads 106a and pads 106b. The pads 106a may include pad 108a, and the pads 106b may include pad 108b. The pads 106a, 106b may be copper pads arranged in a pattern. The pads 106a, 106b may be on the top layer of the PCB. Except for the pad 108a and the pad 108b, the pads 106a, 106b may be surrounded by anti-pad. For example, the pads 106a may include pad 106a-1, which may be surrounded by anti-pad. The anti-pad may insulate the pads 106a, 106b from the copper shape 102. Except for the pad 108a and the pad 108b, the pads 106a, 106b may connect to transmission lines in an inner layer or a bottom layer of the PCB. The pad 108a and the pad 108b may be part of the copper shape 102 or connect directly to the copper shape 102. The copper shape 102 may provide power to a package attached to the pads 106a, 106b through the pad 108a and the pad 108b. Although FIG. 1A shows two pads, the pads 108a, 108b, for providing power to the package, in other designs, the pads 106a, 106b may include fewer than or more than two pads that provide power to a package attached to the pads 106a, 106b.

The pattern of the pads 106a, 106b may correspond to a pattern of solder balls of a BGA. The BGA may be part of a package. The package may be placed on the pads 106a, 106b. A large portion of the copper shape 102 may reside beneath the package after the package is placed on the copper shape 102. There may, however, be portions of the copper shape 102 that do not reside beneath the package after the package is placed on the copper shape 102. For example, a package may cover an area 104 of the copper shape 102 enclosed by the dotted line in FIG. 1A. In some designs, 90% or more of the copper shape 102 may reside beneath the package. In other designs less than 90% of the copper shape 102 may reside beneath the package.

Before the package is placed on the pads 106a, 106b, a solder paste may be placed on the pads 106a, 106b. The solder paste may temporarily hold the solder balls of the BGA on the pads 106a, 106b. Once components have been placed on the PCB, the PCB may undergo a reflow process, during which the solder balls of the BGA become bonded to the pads 106a, 106b. During the reflow process, the PCB may undergo warpage. The heat dissipation of the copper shape 102 may contribute to warpage. Warpage may induce pad cratering under one or more of the pads 106a, 106b. Pad cratering may be a separation between one or more of the pads 106a, 106b and a substrate of the PCB located beneath the pads 106a, 106b. Pad cratering may manifest as a crack beneath a pad. Pad cratering may reduce long-term reliability of a connection between the package and the PCB. Pad cratering may be most severe where displacement caused by warpage is increasing or decreasing rapidly between pads.

The copper shape 102 may include the voids 100. The voids 100 may reduce warpage associated with heat dissipation of the copper shape 102. The voids 100 may prevent pad cratering. The voids 100 may be introduced into the copper shape 102 before a package is placed over the copper shape 102. The voids 100 may relieve stress during reflow and mitigate the risk of solder ball cracks and pad cratering. The copper shape 102 may satisfy applicable power-delivery requirements even with the voids 100. The voids 100 may be indentations or holes in the copper pad 102. The voids 100 may be empty or filled with a non-copper substance. The voids 100 may not serve an insulating function. The voids 100 may not be used to connect a package to the PCB. The voids 100 may be covered by a mask when solder paste is placed on the pads 106a, 106b.

The voids 100 may be generated through a chemical process, a mechanical process, or other type of process. The voids 100 may be generated by removing copper from the copper shape 102. For example, the voids 100 may be generated by cutting the copper from the copper shape 102. The voids 100 may be generated by making indentations in the copper shape 102. The voids 100 may be generated through use of chemical etching. In the alternative, the voids 100 may be created by not placing copper on a substrate in certain areas of the copper shape 102.

The voids 100 may have a particular size at a surface of the copper shape 102. For example, the voids 100 may be 8 mil×8 mil at the surface of the copper shape. In the alternative, the voids 100 may be smaller in area or larger in area than 8 mil×8 mil. In other designs, the voids 100 may have a specific minimum size or a specific maximum size. For example, the voids 100 may all be at least 8 mil×8 mil in size. As another example, the voids 100 may be at most 8 mil×8 mil in size. Viewed looking down at the copper shape 102 from above, the voids 100 may be shapes other than squares. For example, the voids 100 may be lines, circles, triangles, quadrilaterals, rectangles, stars, or any type of polygon. The voids 100 may be uniform in size and shape. In the alternative, the voids 100 may include etchings of different shapes and sizes. For example, some of the voids 100 may be 8 mil×8 mil indentations and some of the voids 100 may be 4 mil×6 mil indentations.

The voids 100 may go through the copper shape 102 to a substrate beneath the copper shape 102. In the alternative, the voids 100 may not go through an entire depth of the copper shape 102. The voids 100 may not be uniform throughout a depth of the voids 100. In other words, cross sections of the voids 100 at different depths of the copper shape 102 may have different areas. In the alternative, the voids 100 may be uniform throughout the depth of the voids 100. The voids 100 do not go through every layer of the PCB. The voids 100 do not go through to an inner copper layer of the PCB. The voids 100 may be empty. In the alternative, the voids 100 may be filled with a non-copper substance.

In some designs, in areas of the copper shape 102 where the voids 100 appear, the voids 100 may be routed in the copper shape 102 with uniform spacing. For example, there may be 8 mil gaps between the voids 100. In other designs, in areas of the copper shape 102 where the voids 100 appear, gaps between voids may be larger or smaller (such as 12 mil. or 6 mil). In some designs, gaps may be measured in terms of an amount of surface area between two voids. For example, there may be 64 mil$^2$ of surface area between voids.

In some designs, in areas of the copper shape 102 where the voids 100 appear, the voids 100 may be routed such that a certain number of voids appear per unit area of the copper shape 102. For example, voids may be routed in a copper shape such that in areas of the copper shape where the voids appear, four voids appear per unit area (such as a 30 mil×30 mil area) of the copper shape. In other designs, in areas of the copper shape 102 where the voids 100 appear, the voids 100 may be routed such that a certain percentage of a surface area of the copper shape 102 is removed by introducing the voids 100. For example, voids may be routed in a copper shape such that in areas of the copper shape where the voids appear, thirty percent of a surface area of the copper is removed by introducing the voids.

In some designs, in areas of a copper shape in which voids appear, the voids may be introduced in the copper shape with non-uniform spacing or density. For example, in some designs, there may be gaps smaller than 8 mil×8 mil between some voids and gaps larger than 8 mil×8 mil between other voids. Gaps between the voids may be any shape or design. In some designs, a first number of voids may be placed per unit area in a first portion of a copper shape and, in a second portion of the copper shape, a second number (different from the first number) of voids may be placed per unit area. In some designs, a first percentage of a first surface area of a copper shape may be removed using voids while a second percentage of a second surface area of the copper shape may be removed using voids.

In areas of the copper shape 102 in which the voids 100 appear, the voids 100 may be routed in one or more different patterns. A pattern may be a particular arrangement of two or more voids that is repeated. For example, the voids 100 may be routed in a mesh pattern. A mesh pattern may be a pattern of generally uniform rows and columns. In other designs, the voids may create a checkerboard pattern, a pattern of diagonal lines, a crossing pattern, or other pattern. In the alternative, in the areas of a copper shape in which voids appear, the voids may not be routed with any particular pattern but may be generally randomly disbursed.

The voids 100 may be sufficient in number such that a pattern of the voids 100 is arranged over a threshold percentage of a surface area of the copper shape 102. The surface area of the copper shape 102 may be an area encompassed by an outer boundary of the copper shape 102. For example, a copper shape may include sufficient voids such that at least 30% of a surface area of the copper shape includes a pattern of the voids. The voids 100 may be sufficient in number such that a pattern of the voids 100 is arranged over a threshold percentage of a surface area of the copper shape 102 that does not include the pads 106a, 106b. For example, a copper shape may include sufficient voids such that at least 50% of an area of the copper shape that does not include pads includes a pattern of the voids. The threshold percentage may depend on one or more factors, such as a size of a copper shape, a type of package, a number of solder balls in a ball grid array to be connected to the copper shape, and power needs of a package to be connected to the copper shape. For example, a first copper shape that will receive a first package thicker than a second package to be received by a second copper shape may have a higher threshold percentage of voids than the second copper shape.

The voids 100 may be arranged over a region of the copper shape 102 having a threshold size. The size of the region may be an area of the copper shape 102 where the voids 100 appear within a threshold distance of each other. For example, the voids 100 may appear within 10 mil of each other in a 500 mil$^2$ area of the copper shape 102. As another example, voids may be arranged over a region of the copper shape and the region may be at least 200 mil$^2$ in size.

A specific number of the voids 100 may be introduced in the copper shape 102. For example, 200 voids may be introduced in a copper shape. As another example, 20 voids may be introduced in a copper shape. In other designs, a threshold number of the voids 100 may be introduced in the copper shape 102. For example, at least 200 voids may be introduced in a copper shape. As another example, at least 10 voids may be introduced in a copper shape. The specific number or the threshold number may depend on one or more factors such as a size of a copper shape, a type of package, a number of solder balls in a ball grid array to be connected to the copper shape, and power needs of a package to be connected to the copper shape. For example, a first copper shape with a size that is larger than a second copper shape may include more voids than the second copper shape.

The copper shape 102 may include one or more areas 132 that do not include the voids 100. The one or more areas 132 may not include the voids 100 for purposes of power regulation or power flow. In other designs, the one or more areas 132 may not include the voids 100 for a different purpose or for no purpose. In FIG. 1A, the one or more areas 132 appear in a center of the copper shape 102. In other designs, the one or more areas 132 may be located in other portions of a copper shape. In FIG. 1A, the one or more areas 132 appear as a continuous area. But in other designs, the one or more areas 132 may be separate by areas that include voids or pads. The location(s) and size of the one or more areas 132 may be based on one or more factors such as a size of a copper shape, a type of package, a number of solder balls in a ball grid array to be connected to the copper shape, power needs of a package to be connected to the copper shape, a number of voids in the copper shape, and a density of voids in the copper shape. For example, one or more areas of a copper shape may not include voids because the one or more areas of the copper shape include a region of the copper shape that is most proximate to pads connected directly to the copper shape as compared to other regions of the copper shape.

Figure 1B:
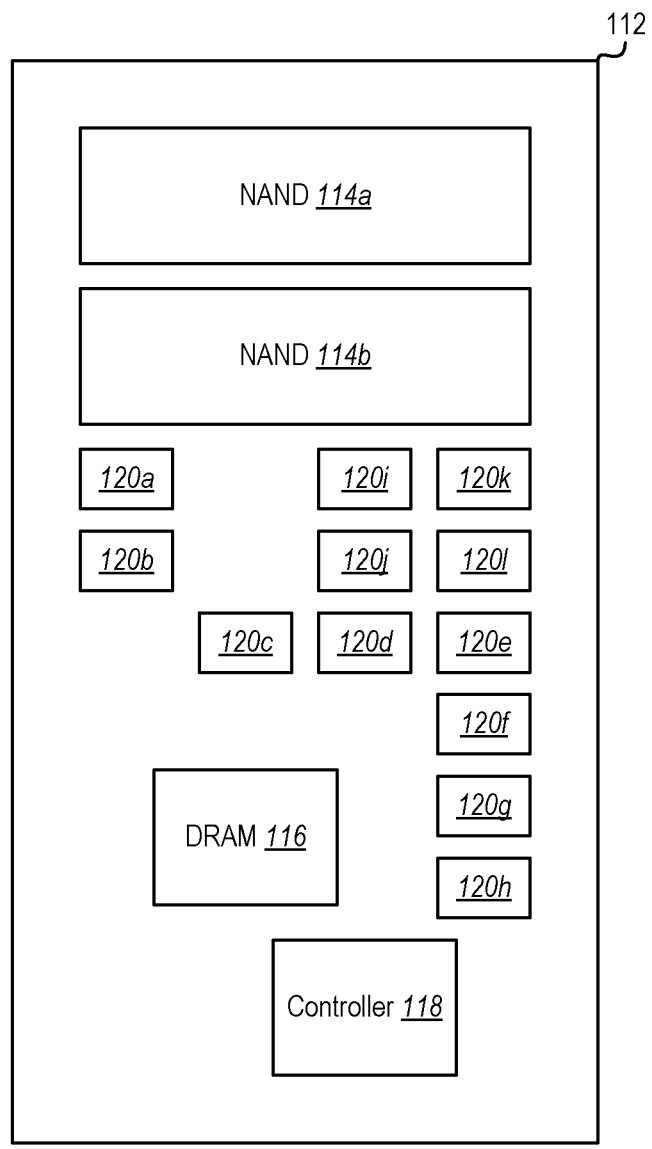
FIG. 1B illustrates an example printed circuit board that includes a copper shape with a mesh pattern of voids.

FIG. 1B illustrates an example PCB 112. The PCB 112 may include multiple layers. For example, the PCB 112 may include three or more conductive copper layers. Surface sides of the PCB 112 may be conductive copper layers. In between those layers and internal copper layers may be heat-protective insulation. Electrical connections between the layers are achieved with vias.

The PCB 112 may include multiple components attached to the PCB 112. For example, the PCB 112 may include a NAND 114a, a NAND 114b, a DRAM 116, a controller 118, and components 120a-1. The NAND 114a, the NAND 114b, the DRAM 116, the controller 118, and the components 120a-1 may be connected to the PCB 112 on a top layer of the PCB 112. The NAND 114a, the NAND 114b, the DRAM 116, the controller 118 may cover more surface area than the components 120a-1. In other designs, a PCB may include more or fewer components. In other designs, a PCB may include different components. The multiple components may be attached to the PCB 112 after the PCB 112 is manufactured. The PCB 112 may be designed specifically for certain components to be attached to the PCB 112. The components may connect with one or more other components on the PCB 112 through microstrip or stripline connections.

The NAND 114a may be a flash memory device or other non-volatile storage technology. The NAND 114a may include multiple die stacked one on top of each other. For example, the NAND 114a may be a DDP or a QDP. The NAND 114a may be part of a package that includes a BGA.

The BGA may be attached to the package. The BGA may be an array of solder balls arranged in a pattern that corresponds to a pattern of pads on the PCB 112, such as the pads 106*a*, 106*b*. Placing the NAND 114*a* on the PCB 112 may have included placing the BGA on the pads of the PCB. During a reflow process, the solder balls of the BGA may have bonded to the pads of the PCB 112.

The NAND 114*a* may be placed over a copper shape, such as the copper shape 102. The NAND 114*a* may overlap less then the entire copper shape. To mitigate warpage and protect against pad craters developing during the reflow process the copper shape underneath the NAND 114*a* may include voids, such as the voids 100.

The NAND 114*b* may be a flash memory device or other non-volatile storage technology. The NAND 114*b* may be identical to the NAND 114*a*. In the alternative, the NAND 114*b* may be different from the NAND 114*a*. For example, the NAND 114*a* may be a DDP and the NAND 114*b* may be a QDP. As another example, the NAND 114*a* and the NAND 114*b* may both include BGAs but the BGAs may have different patterns of solder balls. In that case, the pattern of pads on the PCB 112 beneath the NAND 114*a* may be different from the pattern of pads on the PCB 112 underneath the NAND 114*b*. The NAND 114*b* may be placed over a copper shape, such as the copper shape 102. To mitigate warpage during the reflow process the copper shape underneath the NAND 114*a* may include voids, such as the voids 100.

The DRAM 116 may be dynamic random-access memory or another volatile memory technology. The DRAM 116 may be part of a package that includes a BGA. The BGA may be an array of solder balls arranged in a pattern that corresponds to a pattern of pads on the PCB 112. During a reflow process, the solder balls of the BGA may bond to the pads of the PCB 112. The DRAM 116 may be placed over a copper shape. To mitigate warpage and resulting pad craters during the reflow process the copper shape underneath the DRAM 116 may include voids.

The controller 118 may be a device that interfaces with components of the PCB 112. The controller 118 may be part of a package that includes a BGA. The BGA may be an array of solder balls arranged in a pattern that corresponds to a pattern of pads on the PCB 112. During a reflow process, the solder balls of the BGA may bond to the pads of the PCB 112. The controller 118 may be placed over a copper shape. To mitigate warpage and resulting pad craters during the reflow process the copper shape underneath the controller 118 may include voids.

The components 120*a*-1 may be electronic components that do not include a BGA. The PCB 112 may include pads corresponding to the components 120*a*-1. Before placing the components 120*a*-1 on the PCB 112, solder paste may be placed on the pads corresponding to the components 120*a*-1. The components 120*a*-1 may be placed on the solder paste. During the reflow process, the solder paste may bond the components 120*a*-1 to the PCB 112. The pads corresponding to the components 120*a*-1 may be smaller than the copper shapes underneath the NAND 114*a*, the NAND 114*b*, the DRAM 116, and the controller 118.

Each of the components 120*a*-1 may cover less surface area of the PCB than the NAND 114*a*, the NAND 114*b*, the DRAM 116, and the controller 118. The surface area of the copper shapes underneath the NAND 114*a*, the NAND 114*b*, the DRAM 116, and the controller 118 may each cover a greater area of the PCB 112 than any of the components 120*a*-1. For example, the copper shape underneath the NAND 114*a* may cover a greater area of the PCB 112 than the component 120*c*.

Figure 2:
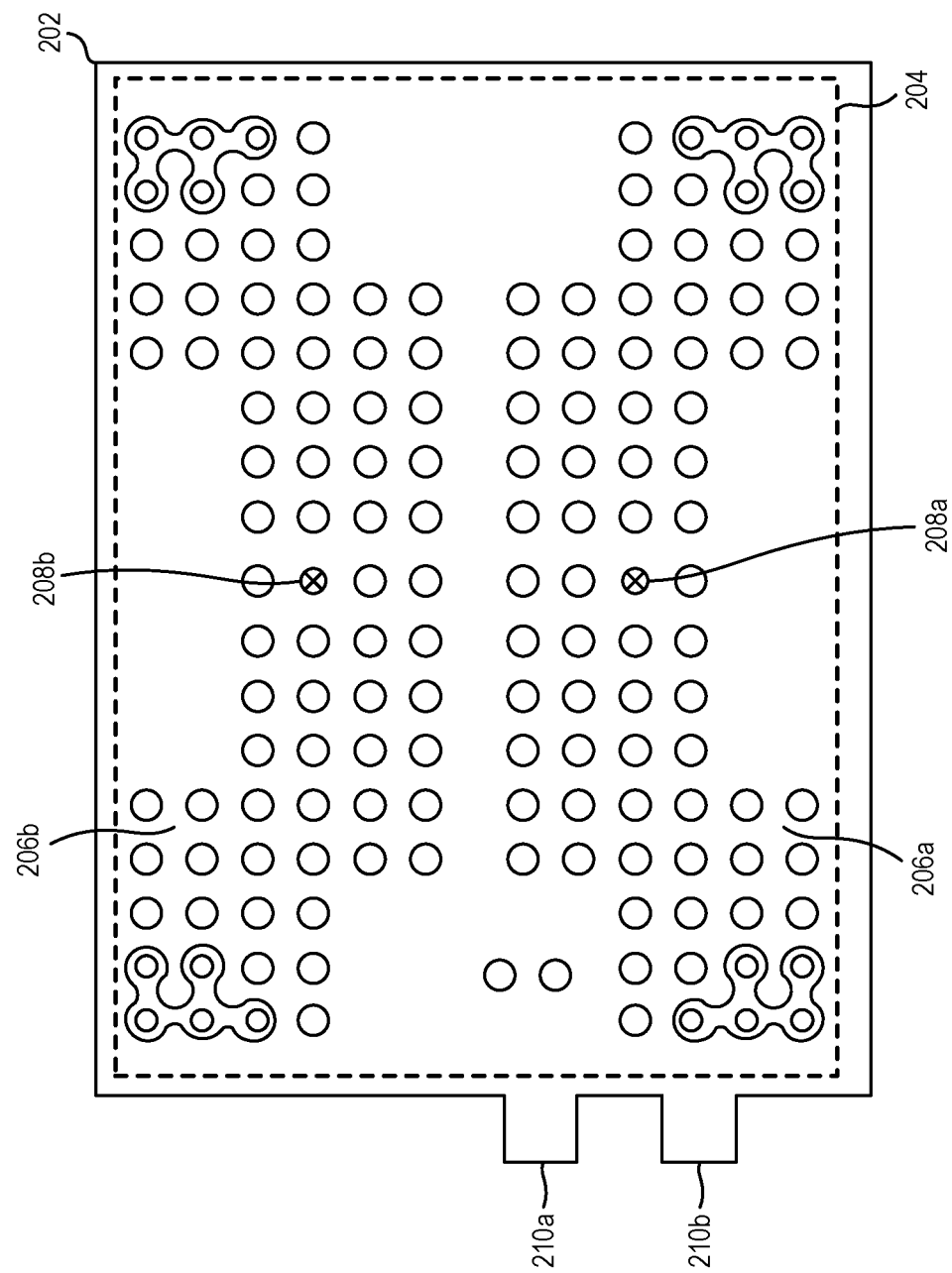
FIG. 2 illustrates an example copper shape that does not include voids.

FIG. 2 illustrates an example of a copper shape 202 that does not include voids. The copper shape 202 may be identical to the copper shape 102 except that the copper shape 102 includes the voids 100 and the copper shape 202 does not include voids. For example, the copper shape 202 may include pads 206*a* and pads 206*b*. The pads 206*a* and the pads 206*b* may be arranged in a pattern identical to the pattern of the pads 106*a* and the pads 106*b*. The pads 206*a* may include pad 208*a*. The pads 206*b* may include pad 208*b*. The pad 208*a* and the pad 208*b* may be part of the copper shape 202 or connect directly to the copper shape 202. The copper shape 202 may include protrusions 210*a*, 210*b*. A package may cover an area 204 of the copper shape 202 shown in FIG. 2 by a dotted line.

Figure 4:
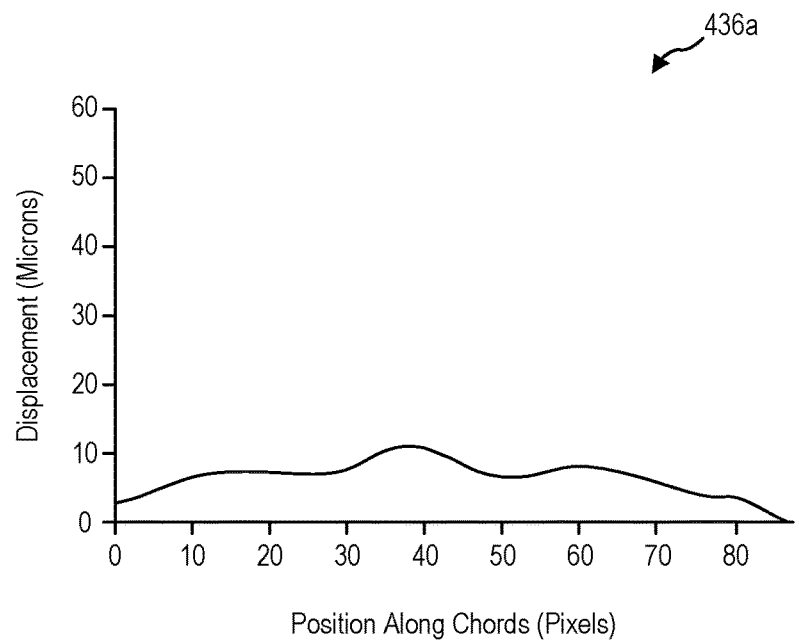
FIG. 4 illustrates improvement printed circuit board displacement resulting from introducing voids in a copper shape.
Figure 4:
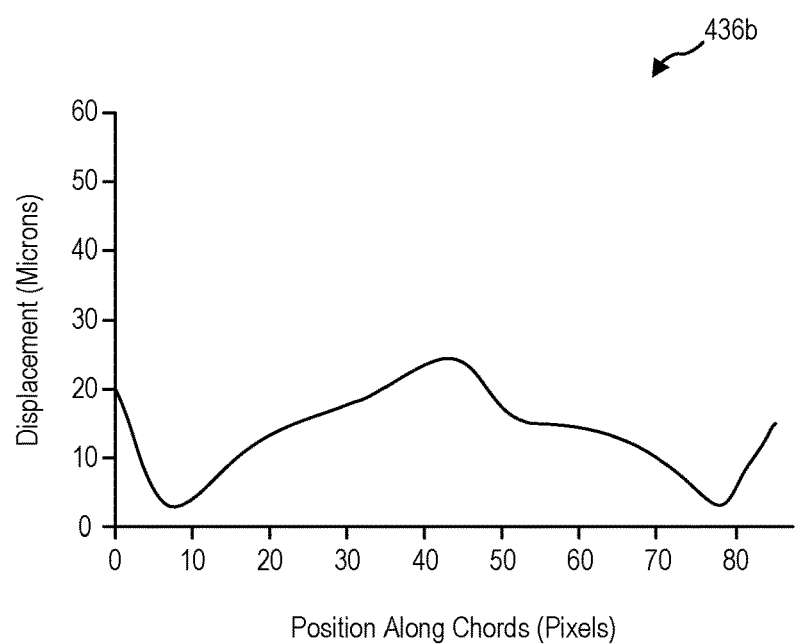

The copper shape 202 may experience, during a reflow process, greater warpage than the copper shape 102 experiences. The copper shape 202 may experience, during a reflow process, a greater difference in displacement across a diagonal of the copper shape 202 than the copper shape 102 experiences. An example of these differences is illustrated in FIG. 4. These differences may contribute to the copper shape 202 experiencing pad cratering and the copper shape 102 not experiencing pad cratering. As a result, the long-term reliability of connections of the copper shape 102 may be better than the copper shape 202.

Figure 3A:
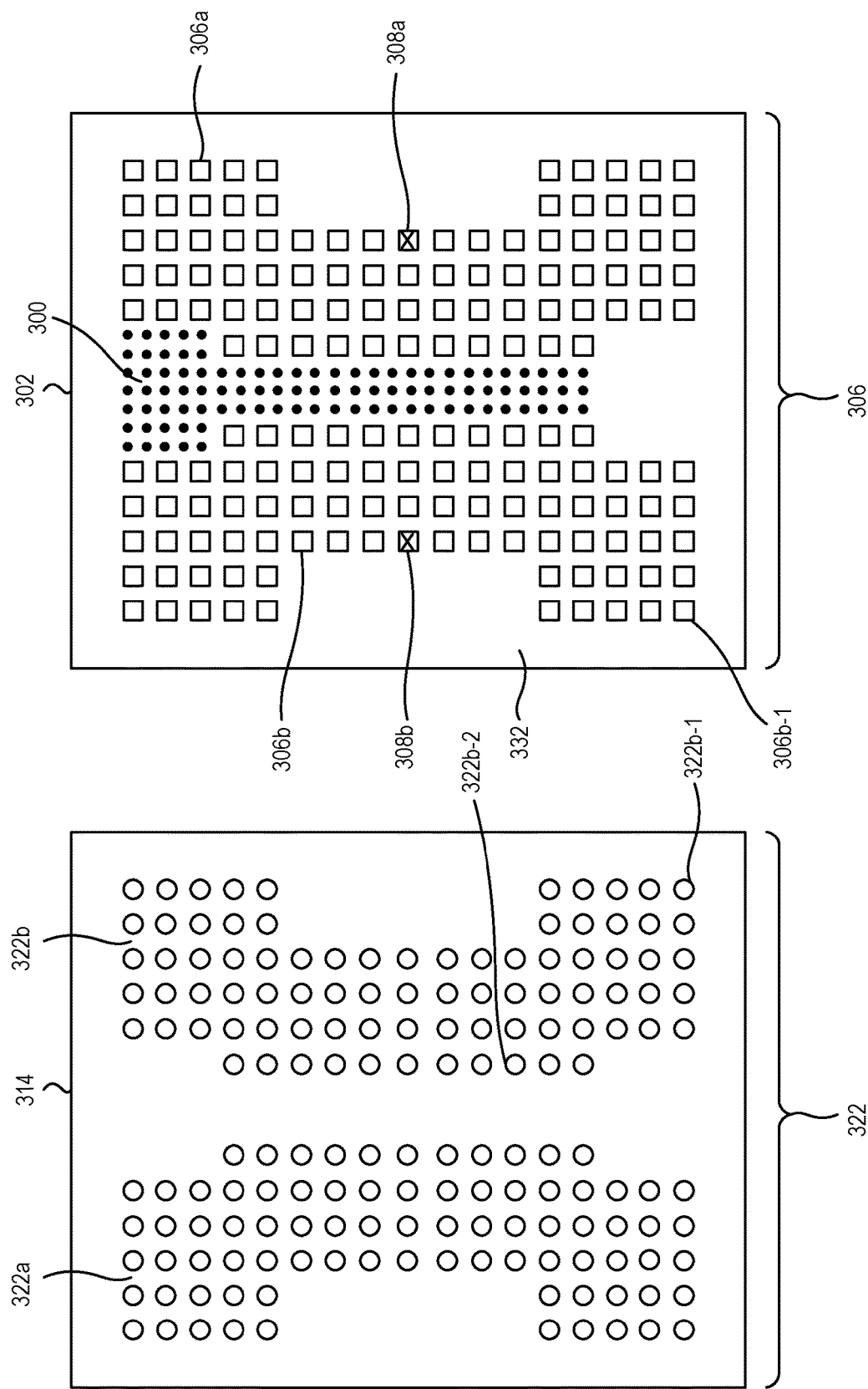
FIG. 3A-3C illustrates an example pair of a ball grid array attached to a package and an array of pads within a copper shape that includes a mesh pattern of voids.

FIG. 3A illustrates a bottom side of a package 314 and a top side of a copper shape 302 that may reside on a top side of a PCB. The package 314 may include an integrated circuit device, such as a NAND. The package 314 may include multiple die.

The bottom side of the package 314 may include a BGA 322. The BGA 322 may include solder balls 322*a* and solder balls 322*b*. The solder balls 322*a*, 322*b* may be balls of solder that connect the package 314 to the PCB. The solder balls 322*b* may include solder ball 322*b*-1 and solder ball 322*b*-2.

The copper shape 302 may be a continuous sheet of copper except for a pad array 306. The pad array 306 may include pads 306*a* and pads 306*b*. In FIG. 3A, the pads 306*a*, 306*b* are shown to have a square shape for ease of visually distinguishing them in FIG. 3A from the solder balls 322*a*, 322*b*. Pads may, however, take any shape, including a generally circular shape as shown in FIG. 1A. The pads 306*a* may include pad 308*a*. The pads 306*b* may include pad 308*b* and pad 306*b*-1. Other than the pads 308*a*, 308*b*, the pads 306*a*, 306*b* may be areas of exposed copper surrounded by anti-pad. The anti-pad may insulate the exposed copper from the copper shape 302. The pad 306*b*-1 may be a pad surrounded by anti-pad. The pads 308*a*, 308*b* may not have anti-pad around them. Instead, the pads 308*a*, 308*b* may be a part of or connect directly to the copper shape 302. The pads 308*a*, 308*b* may be designed to provide power to the package 314.

The solder balls 322*a*, 322*b* of the BGA 322 may be arranged in a particular pattern. The particular pattern may match a pattern of the pads 306*a*, 306*b* of the pad array 306. The pads 306*a*, 306*b* may be areas where solder paste is placed before the package 314 is attached to the PCB. Solder paste may not be placed on any area within a surface area of the copper shape 302 except the pads 306*a*, 306*b*. After the solder paste is placed on the pads 306*a*, 306*b*, the solder balls 322*a*, 322*b* of the BGA 322 may be placed on the pads 306a, 306b of the pad array 306. During the reflow process, the solder balls 322a, 322b may bond to the pads 306a, 306b.

The copper shape 302 may include voids 300. The voids 300 may be indentations in the copper shape 302 where no copper is present. The copper shape 302 may also include one or more areas 332 where the voids 300 are not introduced. The voids 300 may be numerous enough to reduce warpage experienced by the PCB during the reflow process. The voids 300 may be numerous enough to reduce the warpage experienced by the PCB or the copper shape 302 during the reflow process by a certain factor or percentage as compared to the warpage experienced by a PCB or a copper shape that does not include voids. The voids 300 may be sufficiently numerous to reduce a difference in displacement experienced during a reflow process between a middle of the copper shape 302 and an edge of the copper shape 302 as compared to a copper shape that does not include voids.

Figure 3B:
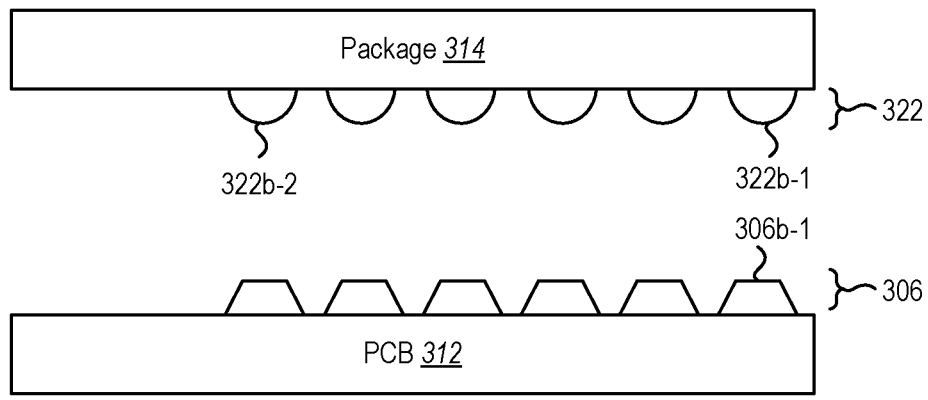

FIG. 3B illustrates a cross-section side view of the package 314 and a PCB 312 on which the copper shape 302 resides. The cross-section side view may be along a diagonal of the copper shape 302. The BGA 322 and the pad array 306 may align. When the BGA 322 is placed on the pad array 306, the solder ball 322b-1 may contact the pad 306b-1. The solder balls 322b of the BGA 322 may not be uniform in height. For example, the solder ball 322b-2 may be taller than the solder ball 322b-1. This difference in height may contribute to the solder ball 322b-2 experiencing different forces and displacement during the reflow process than the solder ball 322b-1. The difference in forces and displacement experienced by the solder ball 322b-2 and the solder ball 322b-1 may contribute to solder joints in between the solder ball 322b-2 and the solder ball 322b-1 being susceptible to solder cratering. The voids 300 in the copper shape 302 may reduce the difference in the forces and displacement experienced by the solder ball 322b-2 and the solder ball 322b-1 and reduce a likelihood that any pads in the pad array 306 experience pad cratering.

Figure 3C:
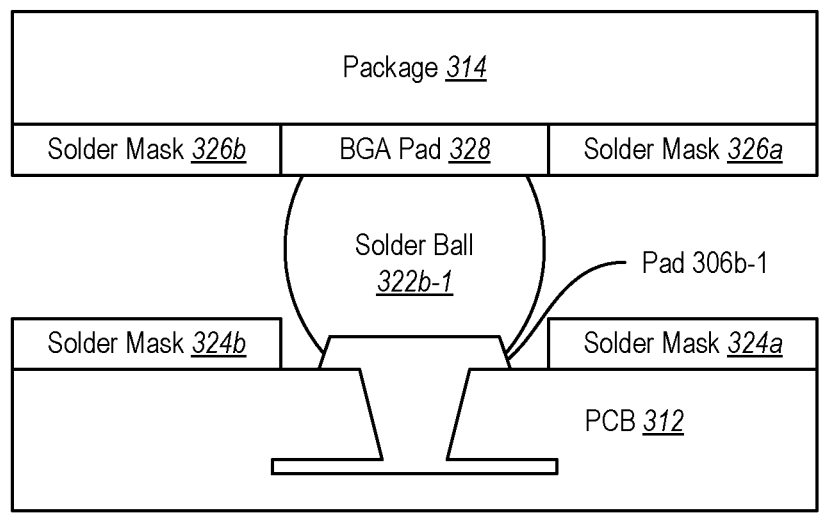

FIG. 3C illustrates a close-up cross-section side view of the solder ball 322b-1 and the pad 306b-1 when the package 314 is placed on the PCB 312. The solder ball 322b-1 may attach to the package 314 at a BGA pad 328. The BGA pad 328 may be surrounded by solder mask 326a, 326b. The pad 306b-1 may attach to the PCB 312. The pad 306b-1 may connect to one or more inner layers of the PCB 312. Solder mask 324a, 324b may act as anti-pad around the pad 306b-1. Solder paste may be placed on the pad 306b-1 before the solder ball 322b-1 is placed on the pad 306b-1. During the reflow process, the solder ball 322b-1 may bond to the pad 306b-1. The solder ball 322b-1 may also experience displacement during the reflow process due to warpage of the PCB 312 and other forces. Any of the solder joints formed by any of the solder balls 322a, 322b and the pads 306a, 306b (other than the pads 308a, 308b) may take the form shown in FIG. 3C.

Under certain conditions, a pad (such as the pad 306b-1) may experience pad cratering and pull away from the PCB 312, resulting in a crack between the pad and the PCB 312. Pad cratering may result in lower reliability of the PCB 312. The voids 300 in the copper shape 302 may reduce the likelihood that any of the pads 306a, 306b experience pad cratering during the reflow process. The voids 300 in the copper shape 302 may prevent the pads 306a, 306b from experiencing pad cratering during the reflow process. The voids 300 may reduce warpage experienced by the PCB 312 and the copper shape 302 during the reflow process. The voids 300 may reduce a difference in displacement experienced by the pad 306b-1 and a pad corresponding to the solder ball 322b-2.

FIG. 4 shows graph 436a and graph 436b. The graph 436a may represent displacement experienced by points along a diagonal line from a bottom left corner of the copper shape 102 to a top right corner of the copper shape 102 shown in FIG. 1A. The displacement may be measured at a particular temperature (such as 150° F.) during a simulation of a reflow process. The graph 436b may represent displacement experienced by points along a diagonal line from a bottom left corner of the copper shape 202 to a top right corner of the copper shape 202 shown in FIG. 2. The displacement may be measured at a particular temperature (such as 150° F.) during a simulation of a reflow process. The graph 436a and the graph 436b illustrate that the copper shape 102, which includes the voids 100, experiences less change in displacement across the copper shape 102 than the copper shape 202, which does not include voids. For example, between pixel 20 and pixel 30 in the graph 436a, the change in displacement may be less than five microns. In the graph 436b, in contrast, the change in displacement between pixel 20 and pixel 30 is close to 10 microns. The rate of change of displacement across the copper shape 102 is also less than the copper shape 202. These differences may result at least in part from the voids 100 in the copper shape 102. These differences may result in the copper shape 102 not experiencing pad cratering while the copper shape 202 does experience pad cratering.

Figure 5A:
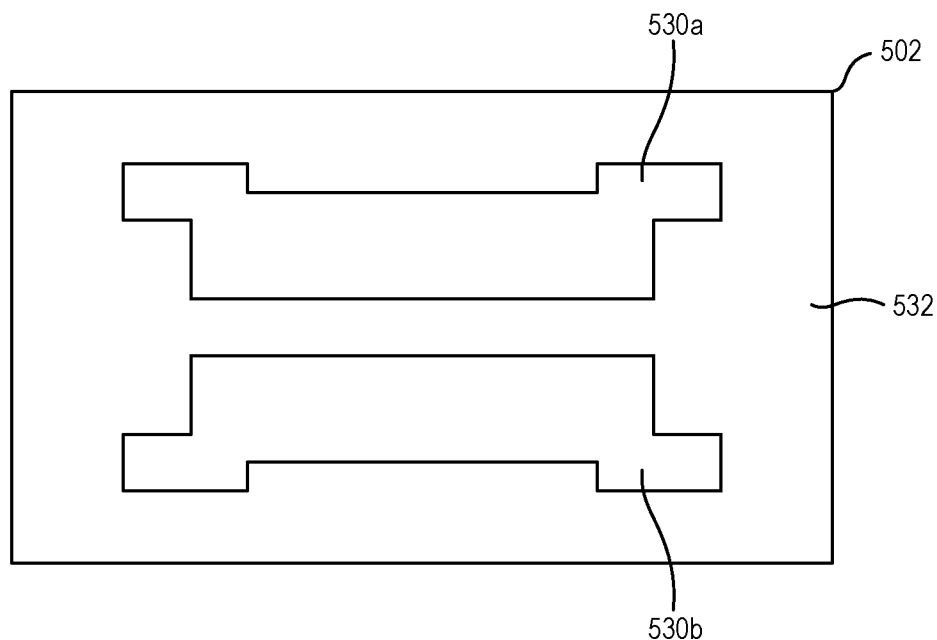
FIG. 5A illustrates areas of a copper shape that may be designated for pads and voids.

FIG. 5A illustrates an example copper shape 502. The copper shape 502 may include pad area 530a and pad area 530b. The pad areas 530a, 530b may be regions of the copper shape 502 where pads are located. The pad areas 530a, 530b may include areas between the pads. The pad areas 530a, 530b may be regions of the copper shape 502 in which pads are within a threshold distance of each other. In FIG. 5A, shows two pad areas, the pad area 530a and the pad area 530b. In other designs, there may be fewer pad areas or more pad areas. In other designs, pad areas may have shapes different from the shape of the pad areas 530a, 530b.

The copper shape 502 may include region 532, which may be an area of the copper shape 502 other than the pad areas 530a, 530b. The region 532 may be covered by a mask when solder paste is placed on pads in the pad areas 530a, 530b. Portions of the pad areas 530a, 530b that are not pads may also be covered by the mask.

In some designs, voids are located only in the region 532 and not the pad areas 530a, 530b. Voids may be placed in some of the region 532. In other designs, voids may be placed throughout the region 532. Voids may be placed with uniform density in some of or throughout the region 532. In other designs, voids may be routed with non-uniform density. Voids may be routed in a uniform pattern in some of or throughout the region 532. Voids may be routed in multiple patterns in some of or throughout the region 532. Voids may be routed in one or more densities in some of or throughout the region 532. Voids may be routed in a threshold percentage of the region 532. A threshold number of voids may be routed in the region 532.

Figure 5B:
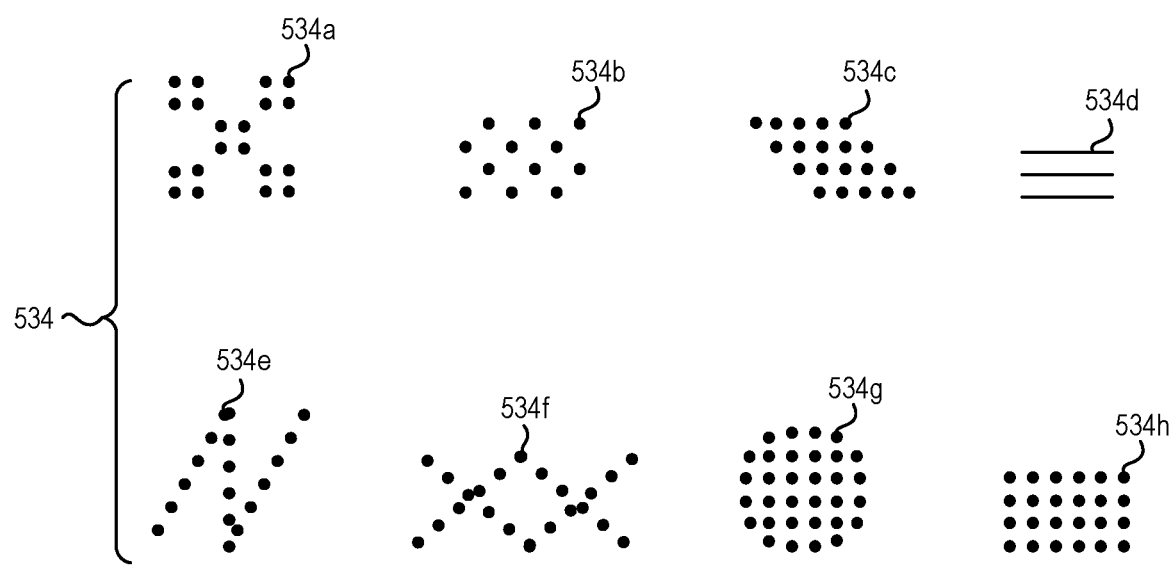
FIG. 5B illustrates example patterns for voids in a copper shape.

FIG. 5B illustrates example patterns 534 of voids that may be placed in the region 532. The example patterns 534 include a checkboard pattern 534a, a pattern 534b, a diagonal mesh pattern 534c, a line pattern 534d, a zig-zag pattern 534e, a crossing pattern 534f, a circle pattern 534g, and a mesh pattern 534h.

Figure 6:
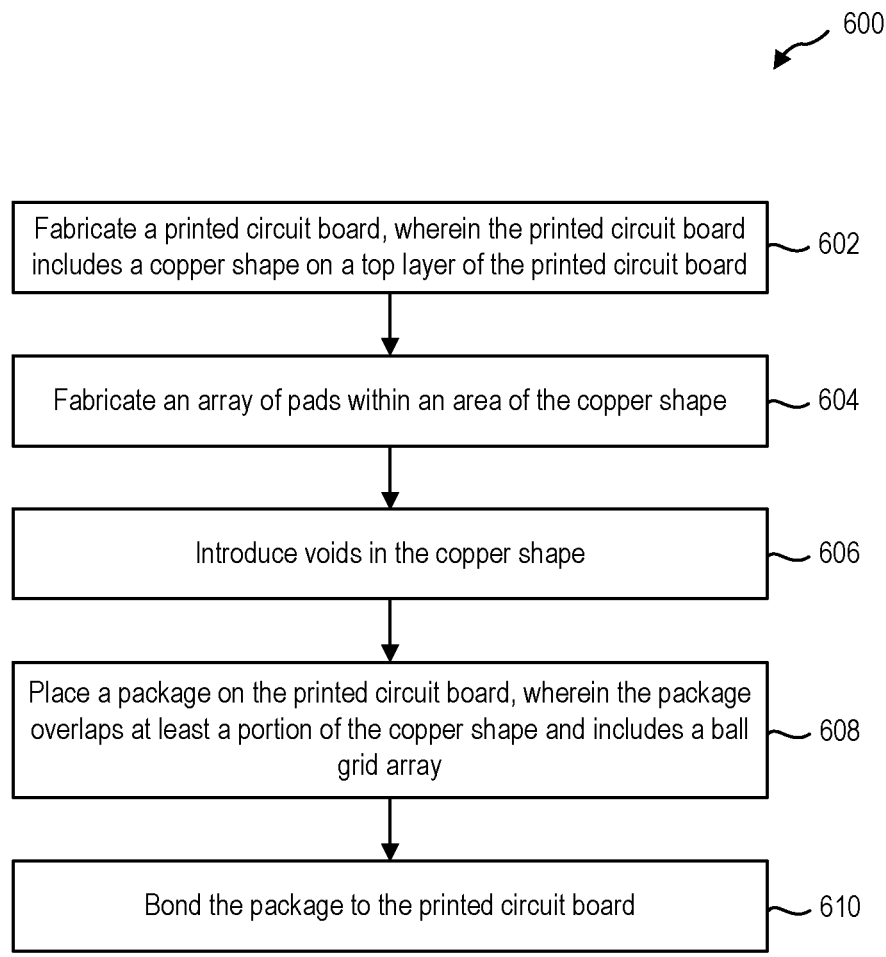
FIG. 6 illustrates an example method for mitigating warpage in a printed circuit board during a reflow process.

FIG. 6 illustrates an example method 600 for mitigating pad cratering. The method 600 may include fabricating 602 a printed circuit board, wherein the printed circuit board includes a copper shape on a top layer of the printed circuit board. An outer edge of the copper shape may enclose an area larger than an area covered by an integrated circuit package to be placed over the copper shape.

The method 600 may include fabricating 604 an array of pads within an area of the copper shape. The array of pads may include one or more pads surrounded by anti-pad.

The method 600 may include introducing 606 voids in the copper shape. Introducing 606 the voids in the copper shape may include introducing a sufficient number of voids in the copper shape to reduce warpage experienced by the printed circuit board or the copper shape during a reflow process by a threshold amount or percentage. For example, a sufficient number of voids may be added to the copper shape to reduce warpage experienced by the copper shape by 10%, 20%, 50%, or more. Introducing 606 the voids in the copper shape may include introducing a sufficient number of voids in the copper shape to reduce a difference in displacement across the copper shape.

The method 600 may include placing 608 a package on the printed circuit board, wherein the package overlaps at least a portion of the copper shape and includes a ball grid array. The ball grid array may comprise a pattern of solder balls that mirrors the array of pads within the area of the copper shape. Placing 608 the package on the printed circuit board may include placing solder paste on the array of pads and placing the ball grid array on the array of pads. The package may be a multi-die package. The package may be a NAND.

The method 600 may include bonding 610 the package to the printed circuit board. Bonding 610 the package to the printed circuit board may include placing the printed circuit board in a reflow oven and exposing the printed circuit board to a solder reflow process. The resulting printed circuit board may pass a dye and pry test, even where the package is a multi-die package.

The steps, operations, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

The terms "comprising," "including," and "having" are intended to be inclusive and mean that there can be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A system for mitigating warpage of a printed circuit board, the system comprising:
   the printed circuit board, the printed circuit board comprising:
      an outer copper layer;
      a copper shape within the outer copper layer, wherein the copper shape has an outer edge that encloses an area and the area of the copper shape includes voids, wherein the voids are indentations in the copper shape that do not go through an entire depth of the copper shape; and
      an array of pads within the area enclosed by the copper shape; and
   a package, the package comprising:
      at least one silicon die; and
      a ball grid array, the ball grid array comprising solder balls configured to connect with the array of pads.

2. The system of claim 1, wherein the voids are sufficient in number to reduce a difference in displacement experienced during a reflow process between a middle of the copper shape and an edge of the copper shape.

3. The system of claim 1, wherein the voids are arranged in a mesh pattern and the mesh pattern is arranged over a threshold percentage of the area enclosed by the copper shape and wherein the threshold percentage depends on a thickness of the package.

4. The system of claim 3, wherein the voids are 8 mil×8 mil.

5. The system of claim 1, wherein the at least one silicon die comprises two or more silicon die.

6. The system of claim 5, wherein the solder balls are not uniform in height.

7. The system of claim 1, wherein the printed circuit board includes three or more layers of copper.

8. The system of claim 1, wherein the voids are filled with a non-copper substance.

9. The system of claim 1, wherein a region of the area enclosed by the copper shape does not include the voids.

10. The system of claim 9, wherein the array of pads comprises one or more pads connected directly to the copper shape, the copper shape provides power to the package, and the region is more proximate to the one or more pads connected directly to the copper shape than at least one other region of the copper shape.

11. The system of claim 1, wherein the copper shape includes 30 or more voids.

12. The system of claim 1, wherein one or more of the voids are empty.

13. A printed circuit board comprising:
    an outer copper layer;
    a copper shape within the outer copper layer, wherein the copper shape includes at least 10 voids, wherein the at least 10 voids are arranged in a mesh pattern within a first area of the copper shape but not a second area of the copper shape, wherein the voids are indentations in the copper shape that do not go through an entire depth of the copper shape, and wherein a location and size of the second area are based on power regulation or power flow considerations; and
    an array of pads arranged within an area of the copper shape, the array of pads configured to receive a ball grid array attached to a package.

14. The printed circuit board of claim 13, wherein the array of pads comprises pads separated from the copper shape by anti-pad.

15. The printed circuit board of claim 14, wherein the array of pads comprises one or more pads connected directly to the copper shape and the one or more pads are more proximate to the second area than to other areas of the copper shape.

16. The printed circuit board of claim 13, wherein one or more of the at least 10 voids are at least 8 mil×8 mil.

17. The printed circuit board of claim 13, wherein the printed circuit board includes three or more layers of copper.

18. The printed circuit board of claim 17, wherein the at least 10 voids do not penetrate to a layer of copper below the outer copper layer.

19. The printed circuit board of claim 13, wherein the location and the size of the second area are further based on one or more of a size of the copper shape, a type of a package to be connected to the copper shape, a number of solder balls in the ball grid array, power needs of the package to be connected to the copper shape, a number of voids in the copper shape, and a density of voids in the copper shape.

20. A method for mitigating warpage in a printed circuit board, the method comprising:
fabricating a copper shape on a top layer of the printed circuit board;
fabricating an array of pads within the copper shape, wherein the array of pads comprises a first pad area and a second pad area, wherein pads within the first pad area are within a threshold distance of each other and pads within the second pad area are within the threshold distance of each other, wherein the first pad area is more than the threshold distance from the second pad area, and wherein the copper shape includes a region between the first pad area and the second pad area; and
introducing voids in the region of the copper shape between the first pad area and the second pad area.

\* \* \* \* \*